(12) United States Patent
Miroshnik et al.

(10) Patent No.: US 7,346,884 B1
(45) Date of Patent: Mar. 18, 2008

(54) INTEGRATED CIRCUIT (IC) HAVING IC FLOORPLAN SILHOUETTE-LIKE POWER SUPPLY NET, AND SEA OF SUPPLY (SOS) ELECTRONIC DESIGN AUTOMATION (EDA) TOOL FOR DESIGNING SAME

(75) Inventors: Yuri Miroshnik, Naaleh (IL); Anatoli Shindler, Jerusalem (IL); Svetlana Yurin, East Palo Alto, CA (US)

(73) Assignee: Silicon Design Systems Ltd., Jerusalem (IL)

( * ) Notice: Subject to any disclaimer, the term of this patent is extended or adjusted under 35 U.S.C. 154(b) by 335 days.

(21) Appl. No.: 11/226,135

(22) Filed: Sep. 13, 2005

Related U.S. Application Data

(62) Division of application No. 10/403,501, filed on Apr. 1, 2003, now Pat. No. 6,957,401.

(51) Int. Cl.
*G06F 17/50* (2006.01)
(52) U.S. Cl. ............... 716/19; 716/1; 716/2; 716/13
(58) Field of Classification Search ............... 716/1, 716/2, 5, 8, 13, 19
See application file for complete search history.

(56) References Cited

U.S. PATENT DOCUMENTS

| | | |
|---|---|---|
| 5,040,144 A | 8/1991 | Pelley et al. |
| 6,446,245 B1 | 9/2002 | Xing et al. |
| 7,080,341 B2 * | 7/2006 | Eisenstadt et al. ............ 716/13 |

* cited by examiner

*Primary Examiner*—Thuan Do
(74) *Attorney, Agent, or Firm*—Blakely, Sokoloff, Taylor & Zafman LLP

(57) ABSTRACT

An integrated circuit (IC) having an IC floorplan silhouette-like power supply net, and a computer executable Sea of Supply (SoS) Electronic Design Automation (EDA) tool for automatically designing same. An IC floorplan silhouette-like power supply net preferably includes both a Sea-of-Supply (SoS) power net and a Sea-of-Supply (SoS) ground net each exclusively occupying different layers of the two lowermost metal layers of an interconnect structure overlying its underlying transistor embedded silicon based structure. The SoS nets are the logical complement of preferably all the exempt areas of an IC floorplan.

5 Claims, 6 Drawing Sheets

INTEGRATED CIRCUIT (IC) HAVING IC FLOORPLAN SILHOUETTE-LIKE POWER SUPPLY NET, AND SEA OF SUPPLY (SOS) ELECTRONIC DESIGN AUTOMATION (EDA) TOOL FOR DESIGNING SAME

CROSS-REFERENCE TO RELATED APPLICATION

The present application is a divisional of U.S. patent application Ser. No. 10/403,501, filed Apr. 1, 2003 now U.S. Pat. No. 6,957,401.

FIELD OF THE INVENTION

The invention is in the field of Integrated Circuit (IC) design in general, and IC power supply net design in particular.

BACKGROUND OF THE INVENTION

ICs ranging from ASICs to full custom ICs include a transistor embedded silicon based structure, and an interconnect structure with metal layers for power routing purposes, namely, the provision of an IC power supply net, and transistor interconnection purposes. An IC power supply net includes a power net for connection to the power ports (hereinafter denoted "$V_{DD}$ ports") of an IC's power consuming entities (hereinafter denoted "PCEs"), and a ground net for connection to their ground ports (hereinafter denoted "GND ports"). PCEs include full custom macrocells, and standard cell placement areas and, since an IC can have a hierarchically designed structure, a PCE in a non-leaf layer may include lower layer PCEs. IC power routing starts with the provision of an initial IC floorplan with PCEs, and involves determining an IC power supply net physical layout, calculating the widths of the wires making up its power and ground nets, determining slot spread in the wires to satisfy IC fabrication requirements, passing an IC power supply net verification procedure, and if necessary, modifying the IC floorplan and/or the IC power supply net.

SUMMARY OF THE INVENTION

Generally speaking, a computer executable Sea of Supply (SoS) Electronic Design Automation (EDA) tool in accordance with the present invention is programmed to implement a novel methodology for automating the hitherto manual IC power routing design process to yield a so-called IC floorplan silhouette-like power supply net based on the following two principles: First, each net of an IC floorplan silhouette-like power supply net exclusively occupies a single metal layer (hereinafter denoted "supply layer"). And second, any area of a supply layer unoccupied by PCEs, areas reserved for interconnection purposes, and the like, is assigned to be metal filled hence the term "IC floorplan silhouette-like". By virtue of this logical complement approach, the supply layers assigned for use as an IC floorplan silhouette-like power supply net are entirely occupied by either exempt areas or metal filled areas whereby the former are conceptually islands floating within a so-called Sea-of-Supply power net (hereinafter denoted "SoS power net") and a so-called Sea-of-Supply ground net (hereinafter denoted "SoS ground net"). Moreover, an IC floorplan silhouette-like power supply net has identical SoS power and ground nets except possibly for the locations of their slots because of IC fabrication reasons.

An IC floorplan silhouette-like power supply net preferably occupies the two lowermost metal layers of an interconnect structure immediately overlying its underlying silicon based structure to minimize the need for vias for connecting PCEs thereto, however, other metal layers which may not necessarily be neighboring may also be equally employed as supply layers. The appearance of a SoS net depends on the degree to which its originating IC floorplan can be compacted taking into account the dimensions of its typically rectangular PCEs and other exempt areas. Highly compact IC floorplans with, say, a 90% area utilization, defined as the combined area of an IC floorplan's exempt areas divided by its total area, lead to SoS nets similar in appearance to conventional manually designed nets. However, a SoS net of a less compact IC floorplan having, say, a 70% area utilization, in all likelihood includes one or more very wide metal wires or more aptly termed metal tracts to convey the fact that they have smaller aspect ratios than metal wires.

To summarize, the present invention facilitates an efficient IC power routing design process by negating the need to manually design a layout, determine slot spread, and the like. Moreover, since the present invention can be readily applied to different IC floorplans having the same exempt areas with minimal manual design effort, an IC layout designer is empowered to conveniently test different IC floorplans to determine the optimal IC floorplan and its inherently rendered IC floorplan silhouette-like power supply net. The present invention also benefits ICs having an IC floorplan silhouette-like power supply net in accordance with the present invention since PCEs can be readily provided with several $V_{DD}$ ports and GND ports along their horizontal and vertical edges for connection to a SoS power net and a SoS ground net, respectively, thereby rendering improved port accessibility. Furthermore, an IC having an IC floorplan silhouette-like power supply net enjoys lower noise levels. In this connection, it should be noted that an IC floorplan silhouette-like power supply net in accordance with the present invention may be designed using conventional EDA tools, for example, commercially available inter alia Synopsys, Inc., and Cadence, Inc.

BRIEF DESCRIPTION OF THE DRAWINGS

In order to understand the invention and to see how it can be carried out in practice, a preferred embodiment will now be described, by way of a non-limiting example only, with reference to the accompanying drawings, in which similar parts are likewise numbered, and in which.

DETAILED DESCRIPTION OF PREFERRED EMBODIMENT

Figure 1:
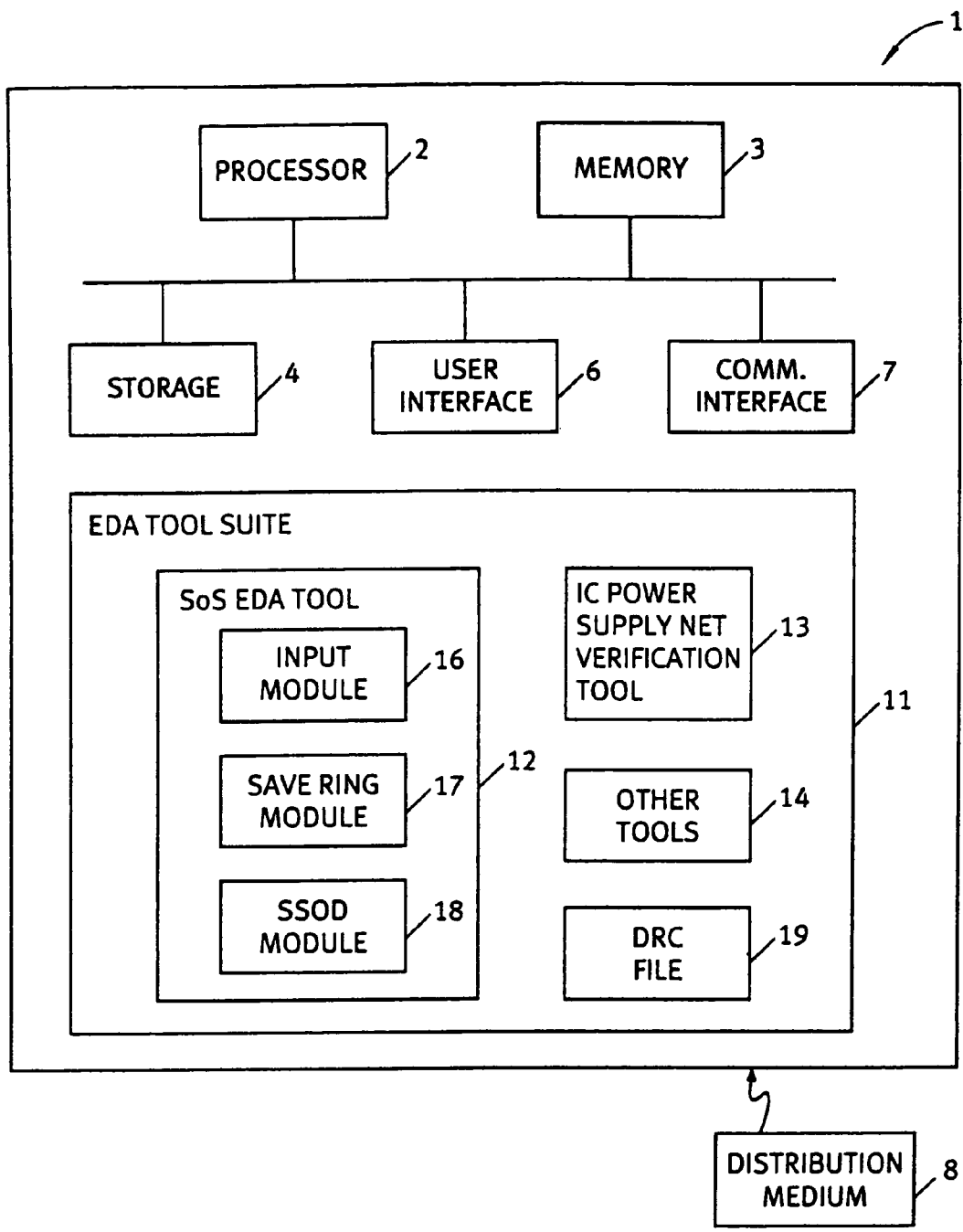
FIG. 1 is a block diagram of a computer executable Sea of Supply (SoS) Electronic Design Automation (EDA) tool for designing an IC floorplan silhouette-like power supply net.

FIG. 1 shows a general purpose computer system 1 including a processor 2, system memory 3, non-volatile storage 4, a user console 6 including a keyboard, a mouse, a display, and the like, and a communication interface 7. The constitution of each of these elements is well known and accordingly will not be described earlier, and each performs its conventional function as known in the art. In particular, the system memory 3 and the non-volatile storage 4 are employed to store a working copy and a permanent copy of the programming instructions implementing the present invention, and to store IC designs. The permanent copy of the programming instructions to practice the present invention may be loaded into the non-volatile storage 4 in the factory, or in the field, through communication interface 7, or through distribution medium 8. Any one of a number of recordable medium such as tapes, CD-ROM, DVD and so forth may be employed to store the programming instructions for distribution purposes.

The computer system 1 is capable of running an Electronic Design Automation (EDA) tool suite 11 including a Sea of Supply (SoS) Electronic Design Automation (EDA) tool 12 for automatically designing IC floorplan silhouette-like power supply nets, an IC Power Supply Net Verification tool 13 for verifying that an IC floorplan silhouette-plan power supply net satisfies predetermined criteria in terms of voltage drop, and electron migration, and possibly other tools 14. The SoS EDA tool 12 includes the following modules:

First, an Input Module 16 for receiving the following inputs:

(1) An IC floorplan including a multitude of exempt areas including PCEs, and other areas reserved, for example, for interconnection purposes. An IC floorplan is typically provided in a commercially recognized format, for example, DEF, and the like, in which the bottom left hand corner of its boundary is designated the origin (0,0) of an XY coordinate system for specifying locations.

(2) Technical information, for example, the width of a PCE's internal power supply ring, the width of a PCE's save ring, and the like.

(3) An SoS net boundary preferably congruent with the boundary of an IC floorplan, thereby maximizing the size of its inherently rendered SoS nets and reducing the need for any manual power routing design.

(4) The designations of the one or two metal layers assigned as the supply layers for an IC floorplan silhouette-like power supply net. The supply layers are preferably the two lowermost metal layers of an interconnect structure commonly referred to as Metal 1 and Metal 2. Metal 1 is preferably employed for the SoS ground net of an IC floorplan silhouette-like power supply net because of noise considerations.

(5) A Boolean flag for selectively invoking (Boolean flag=TRUE) a predetermined slot offset to avoid slot registration of slots on neighboring supply layers.

Figure 2A:
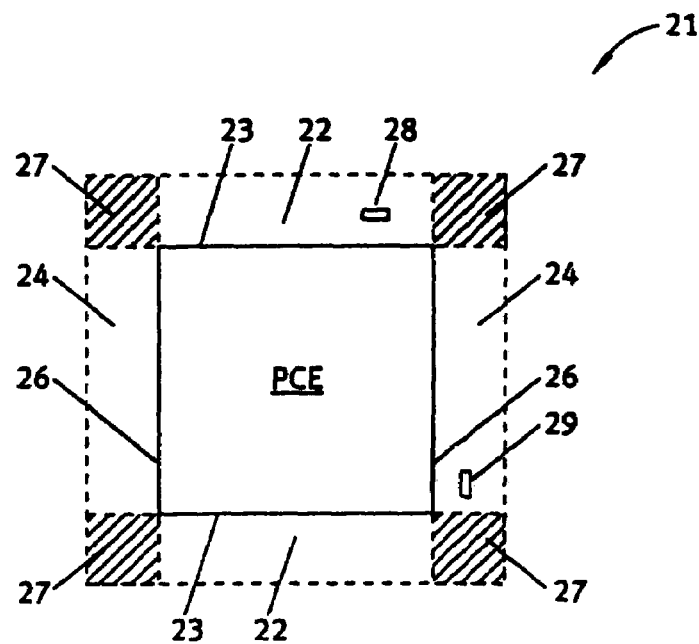
FIG. 2A is a schematic representation of a save ring with non-slotted save ring vertices.
Figure 2B:
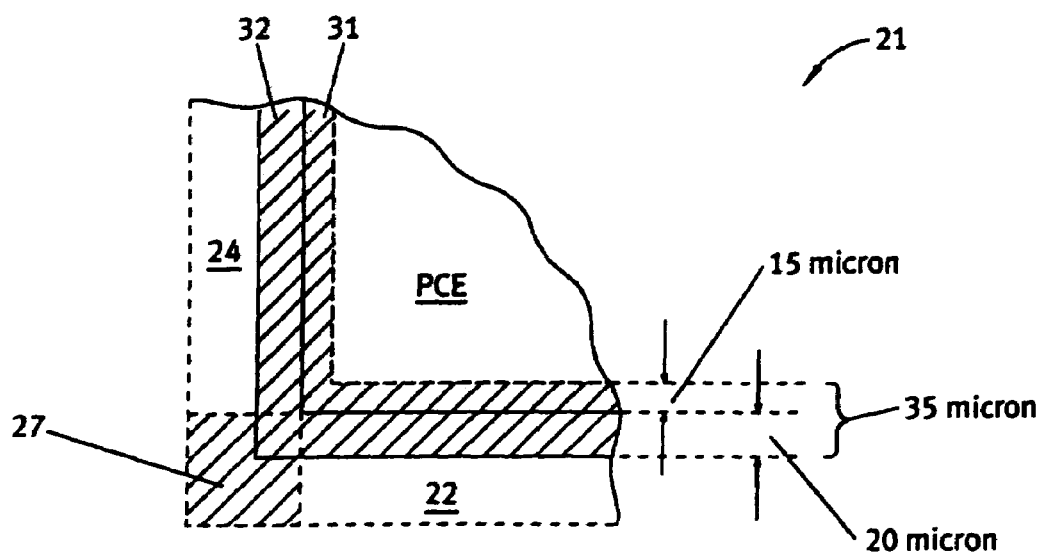
FIG. 2B is a schematic representation showing the non-slotted inner ring of a save ring surrounding a PCE with an internal power supply ring.

Second, a Save Ring Module 17 for provisioning save rings around PCEs, each save ring 21 being constituted by a pair of opposite horizontal save ring regions 22 co-extensive with a PCE's horizontal edges 23, a pair of opposite vertical save ring regions 24 co-extensive with its vertical edges 26, and four square save ring vertices 27 each at the juncture of a horizontal save ring region and a vertical save ring region (see FIG. 2A). Since the preferred direction of electron flow in horizontal save ring regions 22 and vertical save ring regions 24 can be predicted with a high degree of certainty, they are initially intended for provisioning with horizontal slots 28 and vertical slots 29, respectively. However, portions of these regions may be designated as non-slotted regions in accordance with non-slotting rules described hereinbelow with respect to FIGS. 2B-2D when the direction of electron flow cannot be predicted with a reasonable degree of certainty. For this reason, save ring vertices 27 are always designated non-slotted regions (shown by hatching in FIG. 2A).

And lastly, a Slot Spread and Orientation Determination (SSOD) Module 18 for determining slot spread within a SoS net, and slot orientation, namely, horizontal or vertical, in its different regions. The SSOD Module 18 operates in conjunction with a Design Rule Check (DRC) file 19 including slot design rules imposed by IC fabrication requirements. One such design rule is the so-called wide wire design rule which stipulates that slots are required when the shortest dimension of a wire exceeds a predetermined value, say, 35 microns in the case of 0.18 micron IC fab technology. Another such design rule is the introduction of an offset between slots on adjacent supply layers to avoid slot registration. For example, if a Metal 1 slot is located at (X, Y), it is preferable that a Metal 2 slot in registration therewith be offset to, say, (X+10,Y+10). The SSOD Module 18 applies the following non-slotting rules:

Rule (1): The inner ring of a save ring surrounding a PCE up to a maximum predetermined width of, say, 35 microns less the width of its internal power supply ring, if it exists, is classified as a non-slotted region. For example, in the case of a PCE with a 15 micron wide internal power supply ring 31, and a 100 micron wide save ring 21, a 20 micron wide inner ring 32 of the save ring 21 is classified as a non-slotted region (shown by hatching in FIG. 2B).

Rule (2): The overlap portion of a horizontal save ring region and either a non-slotted region or a vertical save ring region is classified a non-slotted region.

Figure 2C:
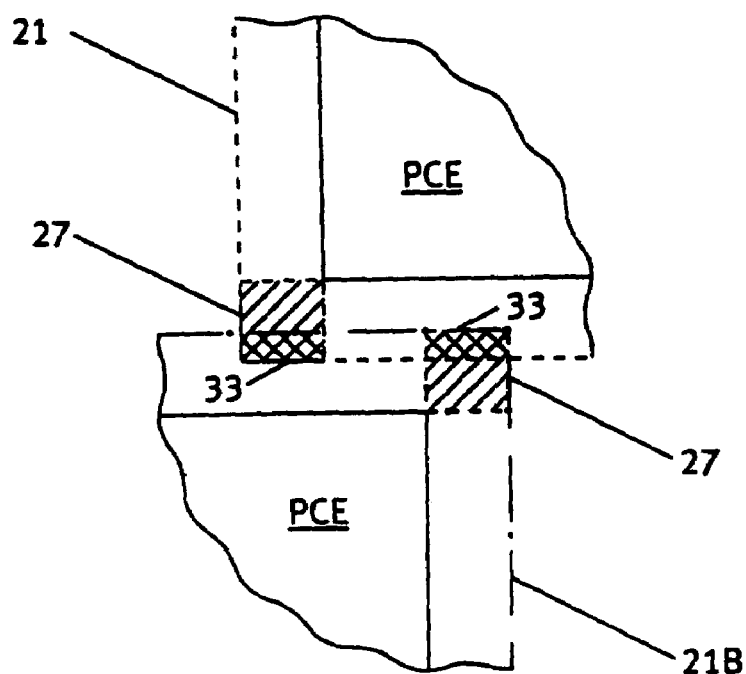
FIG. 2C is a schematic representation showing the non-slotted regions arising from the close proximity of a pair of PCEs.
Figure 2D:
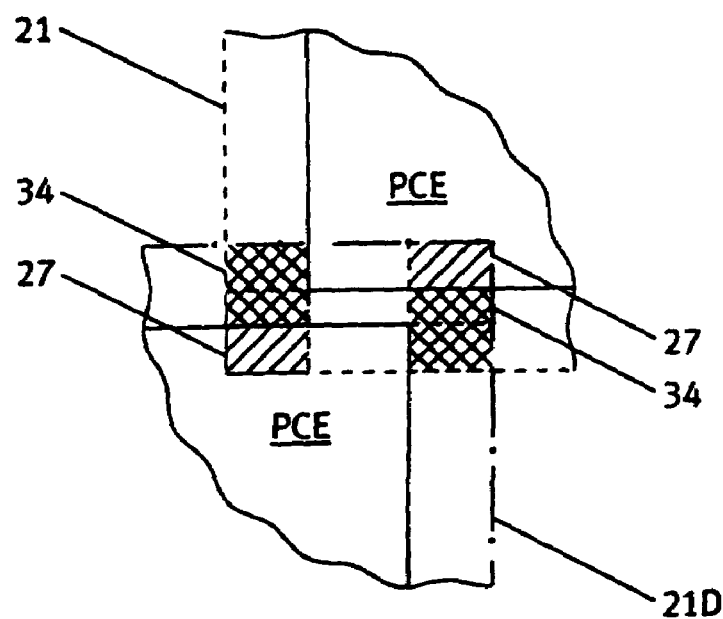
FIG. 2D is a schematic representation showing the non-slotted regions arising from a pair of PCEs which are in even closer proximity than those of FIG. 2C.

FIG. 2C shows two non-slotted regions 33 resulting from the overlap between the bottom left hand corner of a save ring 21A and the top right hand corner of a save ring 21B. FIG. 2D shows two non-slotted regions 34 resulting from the overlap between the bottom left hand corner of a save ring 21C and the top right hand corner of a save ring 21D. The non-slotted regions 34 are larger than the non-slotted regions 33 since save rings 21C and 21D are more overlapping than the save rings 21A and 21B causing the overlap of horizontal save ring regions and vertical save ring regions in addition to the overlap of horizontal save ring regions and save ring vertices as occurs in FIG. 2C.

Rule (3): The same as Rule (2) except in respect of vertical save ring regions. It should be noted that Rules (2) and (3) only become operative in the case of relatively compact IC floorplans and sufficiently wide save rings.

After applying these non-slotting rules, a SoS net includes a patchwork of non-slotted regions, complete horizontal save ring regions and/or portions thereof, complete vertical save ring regions and/or portions thereof, and remaining blank regions which can be equally provisioned with either horizontal or vertical slots without disrupting expected electron flow.

The SSOD Module 18 executes a minus union algorithm to minimize the size of an IC power supply net file outputted by the SoS EDA tool 12. The minus union algorithm involves four steps as follows: First, placing a grid over a SoS net. The grid includes horizontal and vertical grid lines at all abscissas and ordinates at the transitions between non-slotted regions, horizontal save ring regions, and vertical save ring regions. Second, merging contiguous grid rectangles of a SoS net bounded by a pair of adjacent horizontal grid lines to form landscape SoS rectangles defined as having an aspect ratio >1 where an aspect ratio is defined as the width of a SoS rectangle divided by its height. Third, without violating the landscape SoS rectangles, merging contiguous grid rectangles bounded by a pair of adjacent vertical grid lines to form portrait SoS rectangles defined as having an aspect ratio <1. And finally, taking into account the setting of the user set Boolean flag, provisioning horizontal slots to landscape SoS rectangles and vertical slots to portrait SoS rectangles.

Figure 3A:
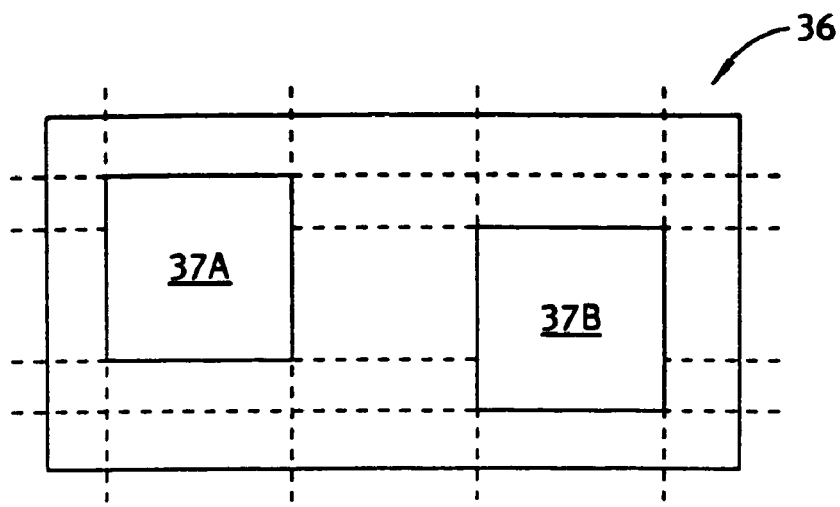
FIG. 3A is a schematic representation showing a grid placed on an IC floorplan as employed by a minus union algorithm implemented by the SoS EDA tool of the present invention.
Figure 3B:
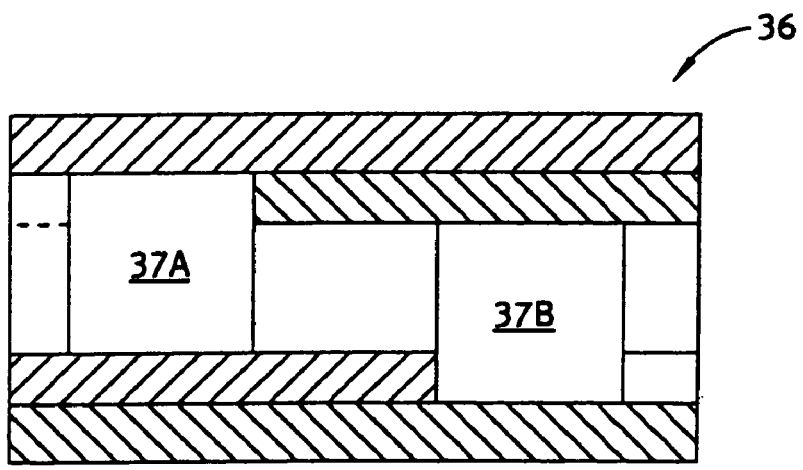
FIG. 3B is a schematic representation showing the merging of contiguous grid rectangles in the horizontal direction as effected by the minus union algorithm.
Figure 3C:
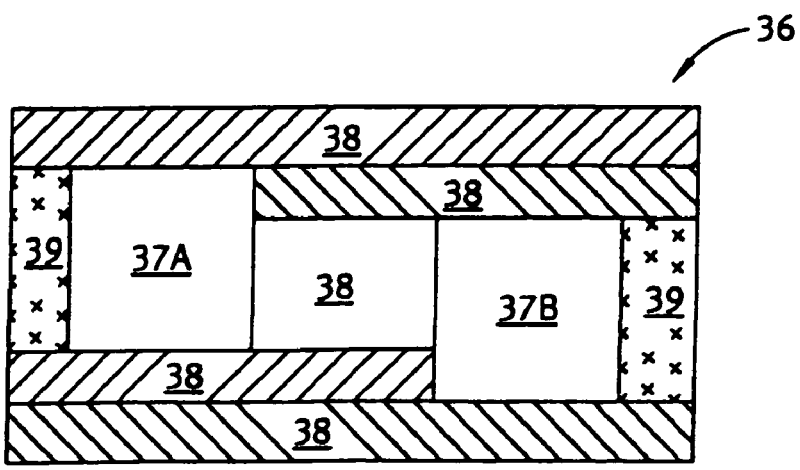
FIG. 3C is a schematic representation showing the merging of contiguous grid rectangles in the vertical direction as effected by the minus union algorithm.

FIGS. 3A-3C illustrate the application of the minus union algorithm to an SoS net 36 inherently rendered by a side-by-side pair of exempt areas 37A and 37B. FIG. 3A shows the horizontal and vertical grid lines placed on the SoS net 36. FIG. 3B shows the merging of contiguous grid rectangles bounded by pairs of adjacent horizontal grid lines to form four landscape SoS rectangles. FIG. 3C shows the merging of contiguous grid rectangles bounded by pairs of adjacent vertical grid lines to form two portrait SoS rectangles. As shown, the SoS net 36 can be uniquely described by seven SoS rectangles, namely, five landscape SoS rectangles 38 and two portrait SoS rectangles 39 to be respectively provisioned with horizontal slot and vertical slots.

The SoS EDA tool 12 outputs an IC power supply net file with the XY coordinates of the SoS rectangles of the SoS nets of an IC floorplan silhouette-like power supply net, and their slots.

Figure 4:
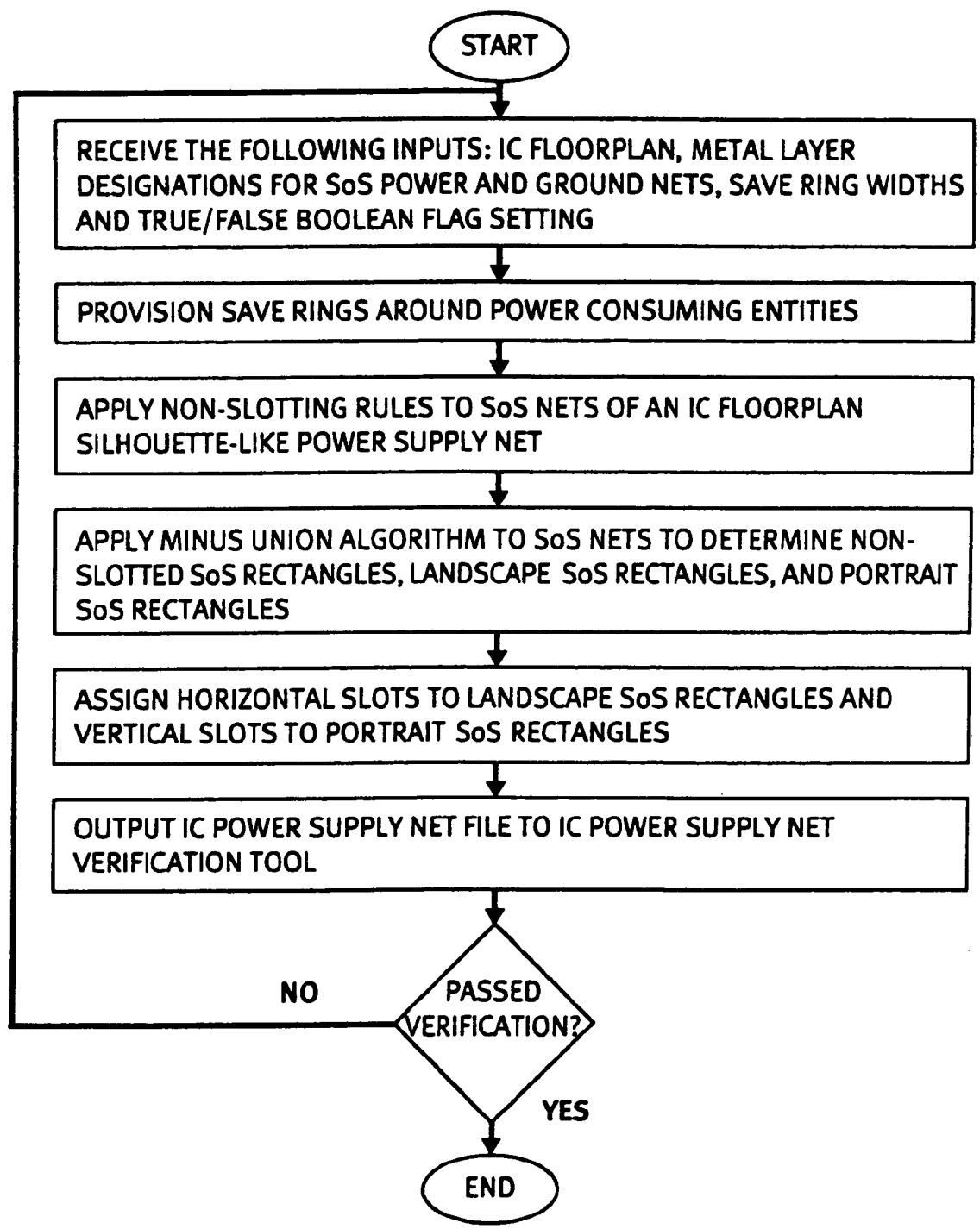
FIG. 4 is a top level flow diagram showing the steps for designing an IC floorplan silhouette-like power supply net in accordance with the present invention.
Figure 5:
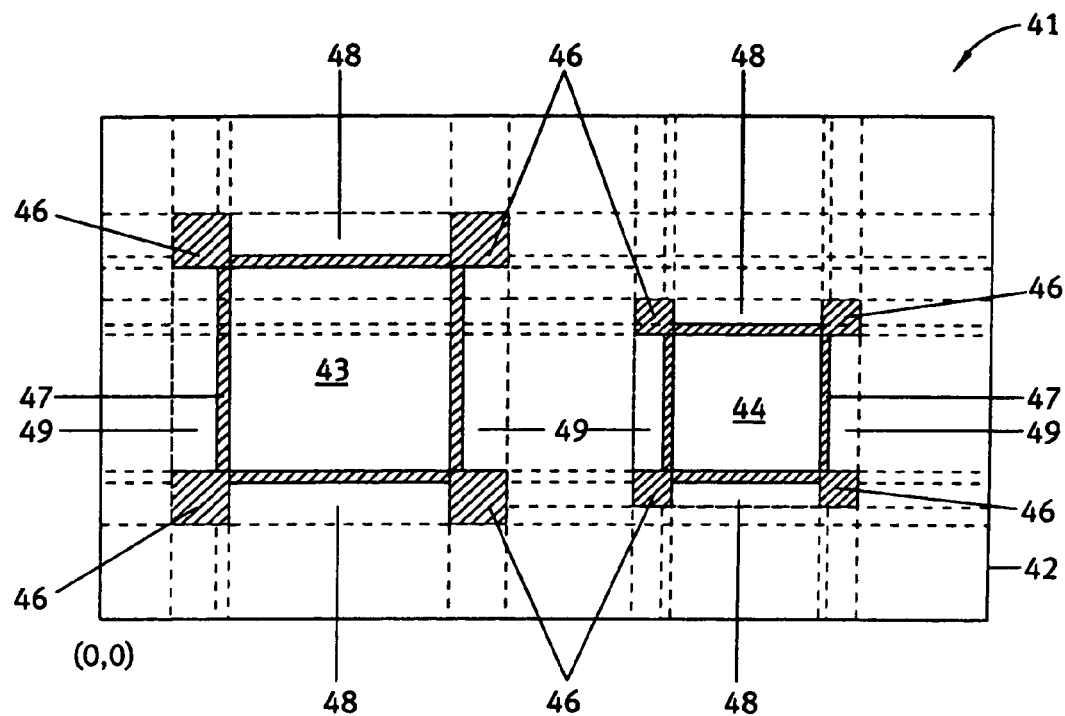
FIG. 5 is a schematic representation of a highly simplified IC floorplan.
Figure 6:
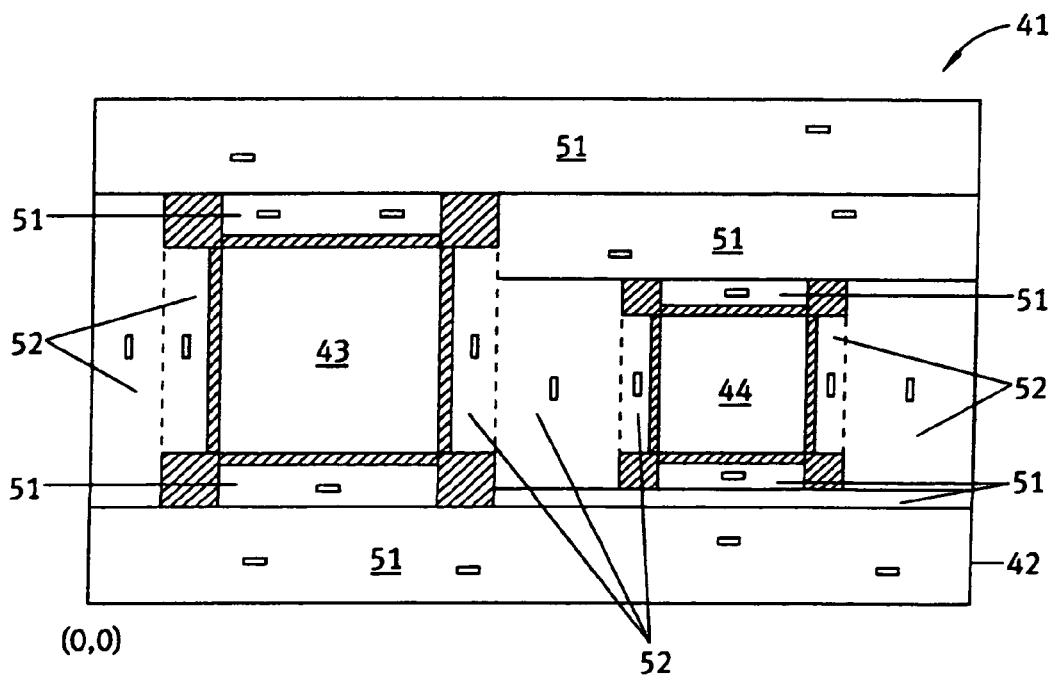
FIG. 6 is a schematic representation of the IC floorplan silhouette-like power supply net in accordance with the present invention inherently rendered by the IC floorplan of FIG. 5.

The operation of the SoS EDA tool 12 for designing an IC floorplan silhouette-like power supply net for a highly simplified IC floorplan 41 is now described with reference to FIGS. 4-6. FIG. 5 shows that the IC floorplan 41 has a 10 mm×10 mm floorplan boundary 42 including two PCEs 43 and 44. The PCE 43 has a 20 micron wide internal power supply ring 37 and is assigned a 80 micron wide save ring. The PCE 44 does not have an internal power supply ring, and is assigned a 60 micron wide save ring.

The Input Module 16 receives the following inputs: The IC floorplan and the SoS net boundary which is congruent with the former's boundary. The designations that Metal 1 and Metal 2 are the supply layers for the SoS ground and power nets, respectively. Boolean flag=TRUE for imposing a (X+10, Y+10) slot offset. The Save Ring Module 17 determines the XY coordinates of the four save ring vertices 46 surrounding each of the PCEs 43 and 44. The Save Ring Module 17 determines the XY coordinates of the 60 micron wide inner rings 47 surrounding each of the PCEs 43 and 44. The vertices 46 and the inner rings 47 are classified as non-slotted regions. The Save Ring Module 17 determines the XY coordinates of the remaining portions of the two horizontal save ring regions 48 and the two vertical save ring regions 49 surrounding each of the PCEs 43 and 44 (see FIG. 5). The SSOD Module 18 places the grid over the IC floorplan 41 and executes the minus union algorithm to yield eight landscape SoS rectangles 51 and seven portrait SoS rectangles 52 (see FIG. 6). The SSOD Module 18 assigns horizontal slots to the eight landscape SoS rectangles 51, and vertical slots to the seven portrait SoS rectangles 52 taking into account the slot offset.

The SoS EDA tool 12 outputs the IC power supply net file including the XY coordinates of the PCEs 43 and 44, the non-slotted regions 46 and 47, the landscape SoS rectangles 51 and their horizontal slots, and the portrait SoS rectangles 52 and their vertical slots of the proposed IC floorplan silhouette-like power supply net for the IC floorplan 41 to the IC Power Supply Design Verification tool 13 for verification purposes. If the proposed IC floorplan silhouette-like power supply net fails verification, then the IC floorplan is modified, for example, by increasing its size to increase the separation between PCEs, reorganizing the locations of its PCEs, and the like, whereupon the SoS EDA tool 12 is run on the modified IC floorplan to yield a modified IC floorplan silhouette-like power supply net. This iterative process is repeated until a proposed IC floorplan silhouette-like power supply net passes verification.

While the invention has been described with respect to a limited number of embodiments, it will be appreciated that many variations, modifications, and other applications of the invention can be made within the scope of the appended claims. For example, the present invention can be applied to a single net of an IC power supply net in which case it would preferably be its ground which is more susceptible to noise than its power net.

The invention claimed is:

1. An Integrated Circuit (IC) comprising a transistor embedded silicon based substrate and an interconnect structure including at least three metal layers for power routing purposes and transistor interconnection purposes, the IC having at least one power consuming entity having at least one VDD port for electrical connection to a power net of an IC power supply net and at least one GND port for electrical connection to a ground net of said IC power supply net, said at least one power consuming entity being graphically representable as an exempt area on an IC floorplan of the IC, at least one of said power net and said ground net being constituted by a Sea-of-Supply (SoS) net exclusively occupying a single metal layer of said interconnect structure, and being the logical complement of all the exempt areas bounded by a SoS net boundary itself bounded by the boundary of the IC floorplan.

2. The IC according to claim 1 wherein a SoS net occupies the lowermost metal layer immediately overlying the silicon based substrate.

3. The IC according to claim 1 wherein a SoS power net and a SoS ground net occupy adjacent metal layers.

4. The IC according to claim 3 wherein a SoS net occupies the lowermost metal layer immediately overlying the silicon based substrate.

5. The IC according to claim 1 wherein a SoS net boundary is substantially congruent with the boundary of the IC floorplan.

* * * * *